US009397186B2

(12) United States Patent
Raj et al.

(10) Patent No.: US 9,397,186 B2
(45) Date of Patent: Jul. 19, 2016

(54) METHOD OF FABRICATING A GALLIUM NITRIDE MERGED P-I-N SCHOTTKY (MPS) DIODE BY REGROWTH AND ETCH BACK

(71) Applicant: Avogy, Inc., San Jose, CA (US)

(72) Inventors: Madhan M. Raj, Cupertino, CA (US); Brian Alvarez, Oceanside, CA (US); David P. Bour, Cupertino, CA (US); Andrew P. Edwards, San Jose, CA (US); Hui Nie, Cupertino, CA (US); Isik C. Kizilyalli, San Francisco, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/602,125

(22) Filed: Jan. 21, 2015

(65) Prior Publication Data
US 2015/0200268 A1    Jul. 16, 2015

Related U.S. Application Data (62) Division of application No. 13/585,121, filed on Aug. 14, 2012, now Pat. No. 8,969,994.

(51) Int. Cl.
*H01L 21/328* (2006.01)
*H01L 21/329* (2006.01)
(Continued)

(52) U.S. Cl.
CPC ...... *H01L 29/66143* (2013.01); *H01L 21/0254* (2013.01); *H01L 21/02664* (2013.01); *H01L 29/0619* (2013.01); *H01L 29/2003* (2013.01);
(Continued)

(58) Field of Classification Search
CPC ................ H01L 21/0254; H01L 29/66143

USPC ......................................... 438/494
See application file for complete search history.

(56) References Cited

U.S. PATENT DOCUMENTS

| 7,183,575 B2* | 2/2007 | Shimoida | H01L 29/861 257/173 |
| 7,186,609 B2* | 3/2007 | Korec | H01L 27/0817 257/510 |

(Continued)

FOREIGN PATENT DOCUMENTS

WO    2014028268 A2    2/2014

OTHER PUBLICATIONS

PCT/US2013/053751, "International Search Report and Written Opinion Received", Feb. 7, 2014, 12 Pages.

*Primary Examiner* — Moazzam Hossain
(74) *Attorney, Agent, or Firm* — Kilpatrick Townsend & Stockton LLP (57) ABSTRACT

An MPS diode includes a III-nitride substrate characterized by a first conductivity type and a first dopant concentration and having a first side and a second side. The MPS diode also includes a III-nitride epitaxial structure comprising a first III-nitride epitaxial layer coupled to the first side of the substrate, wherein a region of the first III-nitride epitaxial layer comprises an array of protrusions. The III-nitride epitaxial structure also includes a plurality of III-nitride regions of a second conductivity type, each partially disposed between adjacent protrusions. Each of the plurality of III-nitride regions of the second conductivity type comprises a first section laterally positioned between adjacent protrusions and a second section extending in a direction normal to the first side of the substrate. The MPS diode further includes a first metallic structure electrically coupled to one or more of the protrusions and to one or more of the second sections.

13 Claims, 11 Drawing Sheets

(51) Int. Cl.
  *H01L 29/868* (2006.01)
  *H01L 29/872* (2006.01)
  *H01L 29/66* (2006.01)
  *H01L 29/06* (2006.01)
  *H01L 29/20* (2006.01)
  *H01L 21/02* (2006.01)
(52) U.S. Cl.
  CPC .... *H01L 29/66121* (2013.01); *H01L 29/66212* (2013.01); *H01L 29/872* (2013.01)

(56) References Cited

U.S. PATENT DOCUMENTS

| | | |
|---|---|---|
| 2006/0022292 A1 | 2/2006 | Shenoy |
| 2006/0289891 A1 | 12/2006 | Hutchins |
| 2007/0029573 A1* | 2/2007 | Cheng ................ H01L 29/0619 257/135 |
| 2007/0096239 A1 | 5/2007 | Cao et al. |
| 2007/0235745 A1* | 10/2007 | Hayashi .............. H01L 29/6606 257/94 |
| 2008/0029838 A1* | 2/2008 | Zhang .................. H01L 21/046 257/475 |
| 2009/0179297 A1 | 7/2009 | Stewart et al. |
| 2011/0101369 A1* | 5/2011 | Zhu ..................... H01L 29/0619 257/76 |
| 2011/0133212 A1 | 6/2011 | Sheridan et al. |
| 2011/0215338 A1* | 9/2011 | Zhang ................ H01L 29/1608 257/73 |
| 2013/0087878 A1* | 4/2013 | Edwards ................ H01L 29/47 257/472 |
| 2016/0043168 A1* | 2/2016 | Ding ................... H01L 29/0626 257/328 |

* cited by examiner

METHOD OF FABRICATING A GALLIUM NITRIDE MERGED P-I-N SCHOTTKY (MPS) DIODE BY REGROWTH AND ETCH BACK

CROSS-REFERENCES TO RELATED APPLICATIONS

This application is a divisional of U.S. patent application Ser. No. 13/585,121, filed on Aug. 14, 2012, entitled "Method of Fabricating a Gallium Nitride Merged P-i-N Schottky (MPS) Diode by Regrowth and Etch Back," the disclosure of which is hereby incorporated by reference in its entirety for all purposes.

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming merged P-i-N Schottky (MPS) diodes using III-nitride semiconductor materials. Merely by way of example, the invention has been applied to methods and systems for manufacturing MPS diodes using a blanket regrowth of gallium-nitride (GaN) based epitaxial layers and an etch back process. These MPS diodes can be used in a range of applications that can benefit from a high-voltage switch with low capacitance and very low leakage current in the off state.

MPS diodes utilize a device structure that can be designed to exhibit the low turn-on voltage of a Schottky diode in the forward direction, and the low reverse leakage current of a P-i-N diode in the reverse. In addition, GaN MPS diodes outperform competitors in Si and SiC material systems due to the outstanding material properties of GaN. As described herein, an MPS diode includes a Schottky contact with embedded p+ regions within the area of the contact. The forward turn-on is dominated by the Schottky portion before the p-n junction turns on at a higher voltage. The reverse mode of operation is dominated by appropriately spaced p-n junctions. The same processing steps used to form the p-type regions may also be utilized as components of edge termination of the device.

According to an embodiment of the present invention, a method for fabricating a merged P-i-N Schottky (MPS) diode in gallium nitride (GaN) based materials is provided. The method includes providing a n-type GaN-based substrate having a first surface and a second surface, forming an n-type GaN-based epitaxial layer coupled to the first surface of the n-type GaN-based substrate, and removing a portion of the n-type GaN-based epitaxial layer to form a plurality of protrusions extending to a predetermined distance from the first surface of the GaN-based substrate. The method also includes forming a p-type GaN-based epitaxial layer using a blanket regrowth process and removing a portion of the p-type GaN-based epitaxial layer to expose surfaces of the n-type GaN-based epitaxial layer. The exposed surfaces have p-type GaN-based regions disposed therebetween. The method further includes forming a first metallic structure electrically coupled to the exposed surfaces of the n-type GaN-based epitaxial layer and the p-type GaN-based regions. A Schottky contact is formed between the first metallic structure and the exposed surfaces of the n-type GaN-based epitaxial layer. Additionally, the method includes forming a second metallic structure electrically coupled to the second surface of the n-type GaN-based substrate.

According to another embodiment of the present invention, a method for fabricating an MPS diode is provided. The method includes providing a III-nitride substrate of a first conductivity type having a first surface and a second surface opposing the first surface and forming a first III-nitride epitaxial layer of the first conductivity type coupled to the first surface of the III-nitride substrate. The first III-nitride epitaxial layer has a first surface adjacent the first surface of the III-nitride substrate and a second surface opposing the first surface. The method also includes forming a mask pattern coupled to the second surface of the first III-nitride epitaxial layer to define etch areas, etching the etch areas to form a plurality of recessed regions extending to a predetermined depth into the first III-nitride epitaxial layer, and regrowing a second III-nitride epitaxial layer that fills the recessed regions and extends to a predetermined height from the second surface of the first III-nitride epitaxial layer. The method further includes forming a second mask pattern coupled to the second III-nitride epitaxial layer to define second etch areas, etching the second etch areas to define a plurality of regrown regions extending in a direction normal to the second surface of the first III-nitride epitaxial layer and to expose a plurality of portions of the first III-nitride epitaxial layer, and forming a first metallic structure electrically coupled to one or more of the plurality of regrown regions and one or more of the exposed portions of the first III-nitride epitaxial layer. Additionally, the method includes forming a second metallic structure electrically coupled to the second surface of the III-nitride substrate.

According to an alternative embodiment of the present invention, an MPS diode is provided. The MPS diode includes a III-nitride substrate having a first side and a second side opposing the first side. The III-nitride substrate is characterized by a first conductivity type and a first dopant concentration. The MPS diode also includes a III-nitride epitaxial structure including a first III-nitride epitaxial layer coupled to the first side of the III-nitride substrate. A region of the first III-nitride epitaxial layer comprises an array of protrusions extending in a direction normal to the first side of the III-nitride substrate. The first III-nitride epitaxial layer also includes a plurality of III-nitride regions of a second conductivity type, each partially disposed between adjacent protrusions of the array of protrusions, wherein each of the plurality of III-nitride regions of the second conductivity type comprises a first section laterally positioned between adjacent protrusions and a second section extending in a direction normal to the first side of the III-nitride substrate. The MPS diode also includes a first metallic structure electrically coupled to one or more of the protrusions and to one or more of the second sections of the plurality of III-nitride regions of the second conductivity type.

Numerous benefits are achieved by way of the present invention over conventional techniques. For devices fabricated using embodiments of the present invention, utilization of the combined material properties of GaN such as high critical electric field, high electron mobility, and high thermal conductivity result in devices with performance advantages. The MPS diodes described herein have lower leakage currents for large reverse voltages compared to standard Schottky diodes, and almost no penalty in forward turn-on voltage. At large reverse bias conditions, the depletion region resulting from one reverse p-n junction will extend and merge with neighboring p-n junctions. In this case, the Schottky metal-to-semiconductor junction will not experience a large reverse electrical field, thus producing less leakage current. The device is suitable for applications where Schottky diodes are currently used including, at high voltage due to the properties of GaN including high critical electric field for breakdown.

The MPS diode retains the fast switching speed of a majority carrier Schottky as long as the forward voltage does not exceed the level (e.g. about 3 volts) at which the p-n junction portion of the device turns on and injects minority carriers into the drift region, which need to be swept out when switching from on to off, as in a typical P-i-N diode. The regime when the P-i-N diode turns on is outside the normal area of operation for the device, but serves a useful purpose for surge current conditions. The minority carrier injection, which is detrimental in terms of switching speed, provides a benefit of lower on-state resistance than a Schottky diode would have due to conductivity modulation of the drift region.

The GaN MPS diode described herein provides a high voltage switch with excellent tradeoff between blocking voltage and forward resistance. The MPS diode has very low leakage current in the off state. A low forward resistance allows for a smaller area diode for a given current rating. Since capacitance scales with area, such a diode will retain excellent switching characteristics due to its low capacitance. The processing and fabrication methods described herein provide an effective edge termination technique suitable for commercial applications of the GaN MPS diode since edge termination enables the diode to reach the full potential associated with the outstanding GaN material properties. These and other embodiments of the invention, along with many of its advantages and features, are described in more detail in conjunction with the text below and attached figures.

DETAILED DESCRIPTION OF SPECIFIC EMBODIMENTS

Embodiments of the present invention relate to electronic devices. More specifically, the present invention relates to forming merged P-i-N Schottky (MPS) diodes using III-nitride semiconductor materials. Merely by way of example, the invention has been applied to methods and systems for manufacturing MPS diodes using gallium-nitride (GaN) based epitaxial layers. These MPS diodes can be used in a range of applications that can benefit from a high-voltage switch with low capacitance and very low leakage current in the off state. Additional description related to MPS diodes is provided in U.S. patent application Ser. No. 13/270,625, entitled "Method of Fabricating a GaN Merged P-I-N Schottky (MPS) Diode," filed on Oct. 10, 2011, the disclosure of which is hereby incorporated by reference in its entirety for all purposes.

GaN-based electronic and optoelectronic devices are undergoing rapid development, and are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, µ, is higher than competing materials for a given doping level, N. This provides low resistivity, ρ, because resistivity is inversely proportional to electron mobility, as provided by equation (1):

$$\rho = \frac{1}{q\mu N}, \quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

Homoepitaxial GaN layers on bulk GaN substrates also have relatively low defect density compared to materials grown on mismatched substrates, such as GaN grown on silicon, silicon carbide (SiC), or sapphire. Homoepitaxial GaN layers on bulk GaN substrates therefore have large minority carrier lifetime in intrinsic and/or low-doped regions of semiconductor devices that use these materials, enhancing the carrier injection effect for wider base regions. The low defect density also gives rise to superior thermal conductivity.

As described herein, MPS diodes created using homoepitaxial GaN layers not only are able to take advantage of the outstanding physical qualities of these materials, but also benefit from the structural advantages provided by combining P-i-N and Schottky diodes. An MPS diode is a device structure that can be designed to exhibit the low turn-on voltage of a Schottky diode in the forward direction, and the low reverse leakage current of a P-i-N diode in the reverse direction. An MPS diode can include a Schottky contact with one or more embedded p-n junctions (or P-i-N regions) within the area of the contact. The forward turn-on voltage is dominated by the Schottky portion before the p-n junctions turn on at a higher forward voltage. The reverse mode of operation is dominated by appropriately spaced p-n junctions. Furthermore, in some embodiments, the same processing used to form the p-n junctions embedded within the area of the Schottky contact also can be used to form edge termination structures to provide edge termination for the MPS diode.

According to embodiments of the present invention, gallium nitride (GaN) epitaxy on bulk or pseudo-bulk GaN substrates is utilized to fabricate MPS diodes and/or edge termination structures not possible using conventional techniques. For example, conventional methods of growing GaN include using a foreign substrate such as SiC. This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

Figure 1:
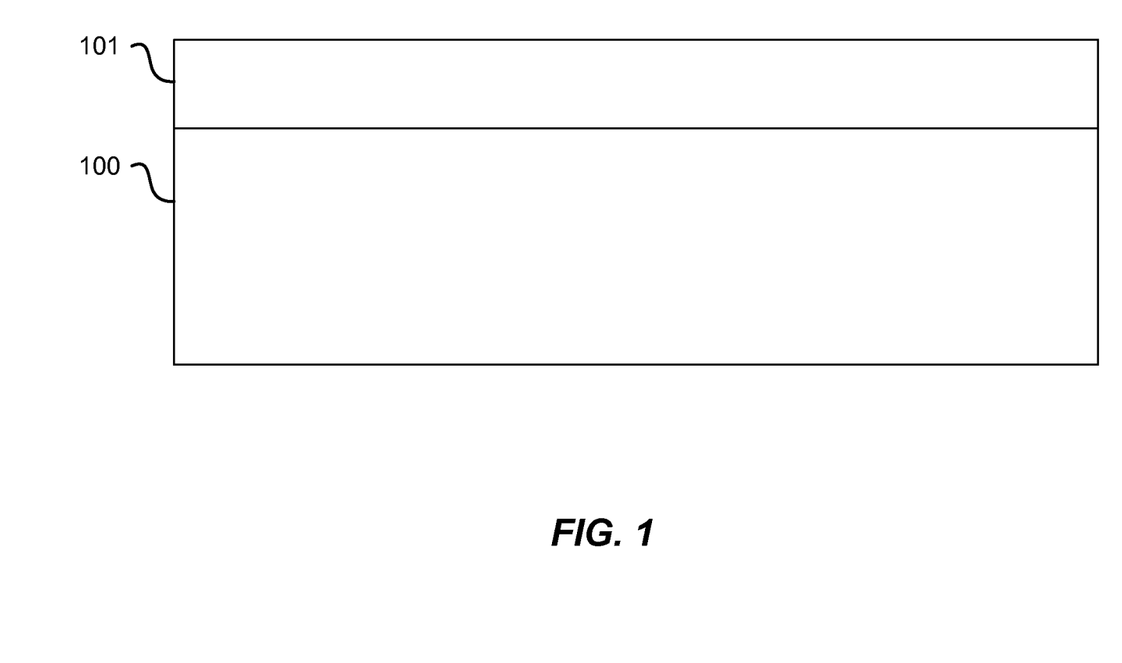
FIGS. 1-6 are simplified cross-sectional diagrams illustrating a process flow for fabrication of an MPS diode according to a first embodiment of the present invention.

FIGS. 1-6 are simplified cross-sectional diagrams illustrating a process flow for fabrication of an MPS diode according to a first embodiment of the present invention. As illustrated by this example, the MPS diode includes a III-nitride drift layer having predetermined doping concentration and thickness that is formed by epitaxial regrowth on a III-nitride substrate. FIG. 1 illustrates an epitaxial system suitable for use with embodiments of the present invention. As illustrated in FIG. 1, a first III-N epitaxial layer 101 (e.g., a GaN lightly doped n-type drift layer) is formed on a III-N substrate 100 (e.g., an n-type GaN substrate) having the same conductivity type. The III-N substrate 100 will be referred to as a GaN substrate below and can be a bulk or pseudo-bulk GaN material on which the first GaN epitaxial layer 101 is grown. Dopant concentrations (e.g., doping density) of the GaN substrate 100 can vary, depending on desired functionality. For example, a GaN substrate 100 can have an n+ conductivity type, with dopant concentrations ranging from $1 \times 10^{17}$ cm$^{-3}$ to $1 \times 10^{20}$ cm$^{-3}$. Although the GaN substrate 100 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first III-N epitaxial layer 101, referred to as a GaN epitaxial layer below, can also vary, depending on desired functionality. The first GaN epitaxial layer 101 can serve as a drift layer for the Schottky region(s) of the MPS diode and an intrinsic component for the P-i-N junction(s) of the MPS diode. Thus, the first GaN epitaxial layer 101 can be a relatively low-doped material. For example, the first GaN epitaxial layer 101 can have an n− conductivity type, with dopant concentrations ranging from $1 \times 10^{14}$ cm$^{-3}$ to $1 \times 10^{18}$ cm$^{-3}$. Furthermore, the dopant concentration can be uniform, or can vary, for example, as a function of the thickness of the drift region.

The thickness of the first GaN epitaxial layer 101 can also vary substantially, depending on the desired functionality. As discussed above, homoepitaxial growth can enable the first GaN epitaxial layer 101 to be grown far thicker than layers formed using conventional methods. In general, in some embodiments, thicknesses can vary between 0.5 μm and 100 μm, for example. In other embodiments thicknesses are greater than 5 μm. Resulting breakdown voltages for the MPS diode 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, germanium, or the like. P-type dopants can include magnesium, beryllium, zinc, or the like.

Figure 2:
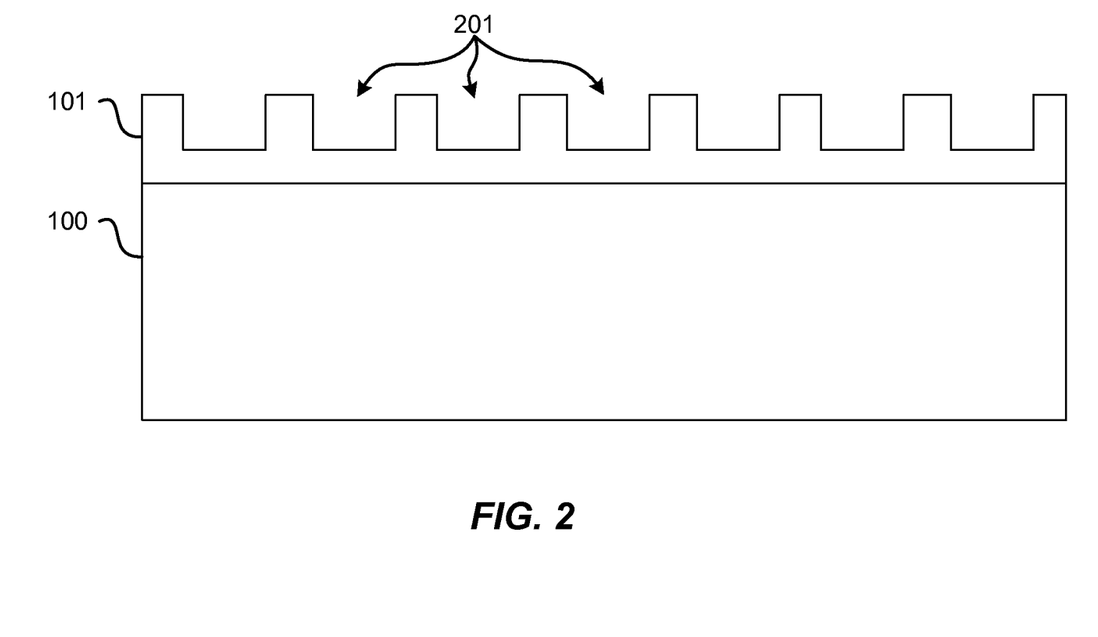

FIG. 2 illustrates the removal of portions of the first GaN epitaxial layer 101 to form openings 201 in the first GaN epitaxial layer 101. As illustrated, the remaining portions of the first GaN epitaxial layer 101 form regions between the openings 201 and the GaN substrate 100, as well as between each of the openings 201 themselves. The removal of portions of the first GaN epitaxial layer 101 can be performed by a controlled etch using an etch mask (not shown but having the dimensions of the openings 201). As described more fully below, epitaxial structures forming part of the P-i-N junctions and edge termination structures for the MPS diode are formed in the openings 201, so the removal of the first GaN epitaxial layer 101 can be designed to stop approximately at a desired depth in the first GaN epitaxial layer 101 for these P-i-N junctions and edge termination structures. Moreover, the removal process may involve multiple etching steps resulting in different depths for different components of the MPS diode 100. Inductively-coupled plasma (ICP) etching and/or other common GaN etching processes can be used. One of ordinary skill in the art would recognize many variations, modifications, and alternatives.

Figure 3:
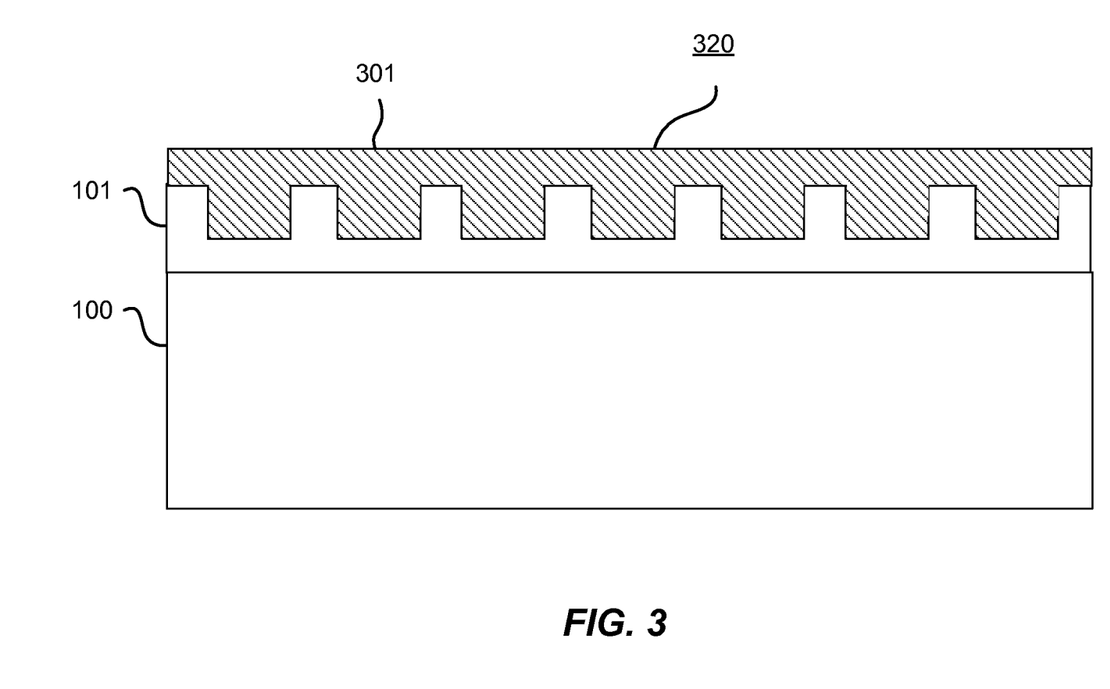

FIG. 3 illustrates epitaxial regrowth according to an embodiment of the present invention. As illustrated in FIG. 3, a III-N epitaxial layer 301 has been regrown, filling the openings 201 and extending to a height greater than the initial height of the first GaN epitaxial layer 101. In order to provide p-n junctions, the III-N epitaxial layer 301 is illustrated as a p-type GaN layer grown on the underlying n-type GaN drift layer. N-type layers can also be regrown according to embodiments of the present invention. Additionally, although regrowth of a p-type layer is illustrated in FIG. 3, an initial n-type layer could be grown, similar to a buffer layer, and then the growth parameters could be modified to regrow a p-type layer. Moreover, other interfacial layers can be regrown, including undoped layers n-type layers, or p-type layers. One of ordinary skill in the art would recognize many variations, modifications, and alternatives.

One method of regrowing epitaxial layer 301 (with a planar regrowth surface 320 in some embodiments) can be through a regrowth process as described more fully in U.S. patent application Ser. No. 13/198,666, entitled "Method and System for Formation of P-N Junctions in Gallium Nitride Based Electronics," filed on Aug. 4, 2011, the disclosure of which is hereby incorporated by reference in its entirety. Blanket regrowth provides benefits in comparison with some selective area regrowth techniques since in some selective regrowth techniques, the hard mask can decompose, resulting in incorporation of the hard mask materials into the epitaxially regrown materials. By using a blanket regrowth process, the regrowth mask is eliminated and material properties are improved.

Referring to FIG. 3, the regrown regions disposed between adjacent protrusions in the first GaN epitaxial layer 101 are characterized by a different conductivity type than the first GaN epitaxial layer 101, thereby forming the P-i-N structures of the MPS diode. In one embodiment, for example, the regrown material has a p+ conductivity type and the first GaN epitaxial layer 101 has an n− conductivity type. The dopant concentration of the regions can be relatively high, for example in a range from about $1 \times 10^{17}$ cm$^{-3}$ to about $2 \times 10^{20}$ cm$^{-3}$. Additionally, the dopant concentration of the regrown regions can be uniform or non-uniform as a function of thickness, providing a highly doped layer suitable for deposition of metallic contacts, in one example.

Figure 4:
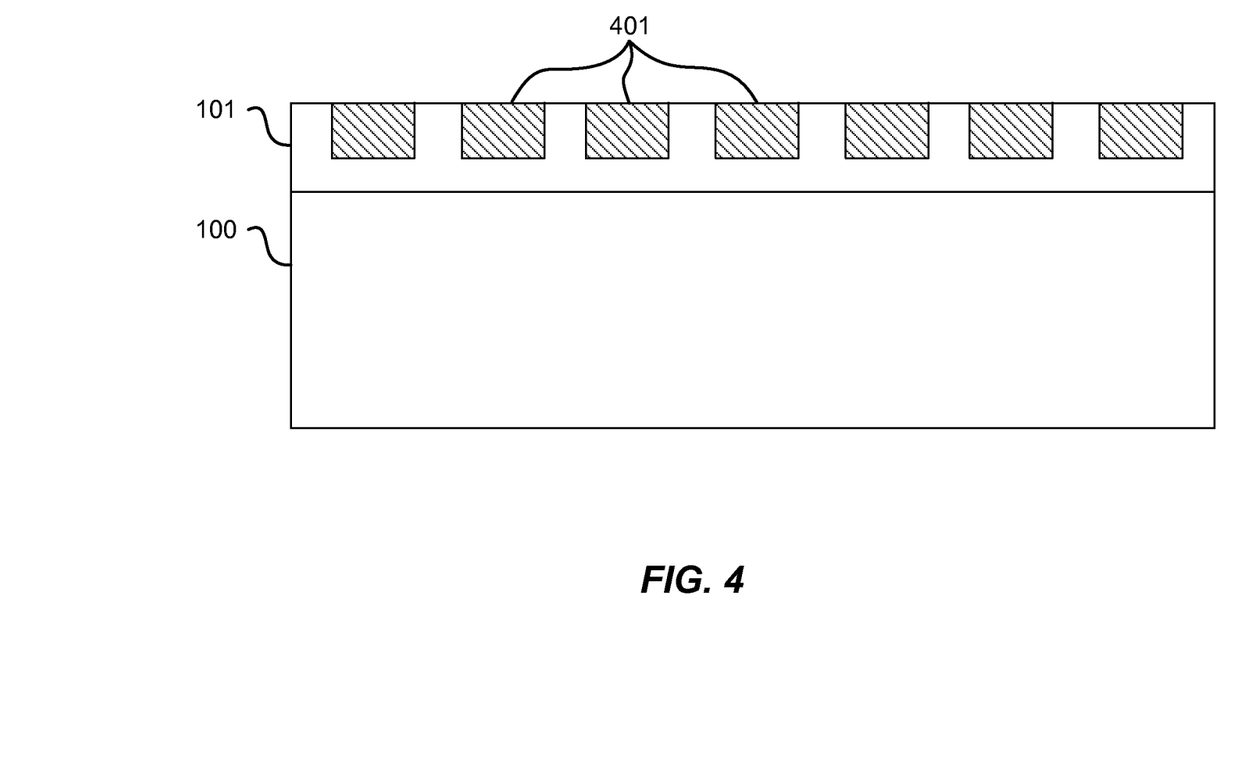

FIG. 4 illustrates the formation of epitaxial regions 401, or structures, in the openings 201 the first GaN epitaxial layer 101. These epitaxial regions 401, can have a conductivity type different than the first GaN epitaxial layer 101. For instance, if the first GaN epitaxial layer 101 is formed from an n-type GaN material, the epitaxial regions 401 can be formed from a p-type GaN material, and vice versa, thereby creating P-i-N and edge termination structures of the MPS diode.

In order to form epitaxial regions 401, which can be referred to as p+ regrowth regions, a blanket etch is performed to reduce the thickness of epitaxial layer 301 and form a substantially planar surface including portions of the p+ regrowth regions and the original material from the first GaN epitaxial layer 101.

The thickness of the resulting epitaxial regions 401 can vary, depending on the process used to form the layer and the device design. In some embodiments, the thickness of the epitaxial regions 401 is between 0.1 μm and 5 μm. In other embodiments, the thickness of the epitaxial regions 401 is between 0.3 μm and 2 μm.

The epitaxial regions 401 can be highly doped, for example in a range from about $1 \times 10^{17}$ cm$^{-3}$ to about $2 \times 10^{20}$ cm$^{-3}$. Additionally, as with other epitaxial layers, the dopant concentration of the epitaxial regions 401 can be uniform or non-uniform as a function of thickness, depending on desired functionality. In some embodiments, for example, the dopant concentration increases with thickness, such that the dopant concentration is relatively low near the GaN substrate 100 and increases as the distance from the GaN substrate 100 increases. Such embodiments provide higher dopant concentrations at the top of the epitaxial regions 401 where a metal contact can be subsequently formed. Other embodiments utilize heavily doped contact layers (not shown) to form ohmic contacts.

Figure 5:
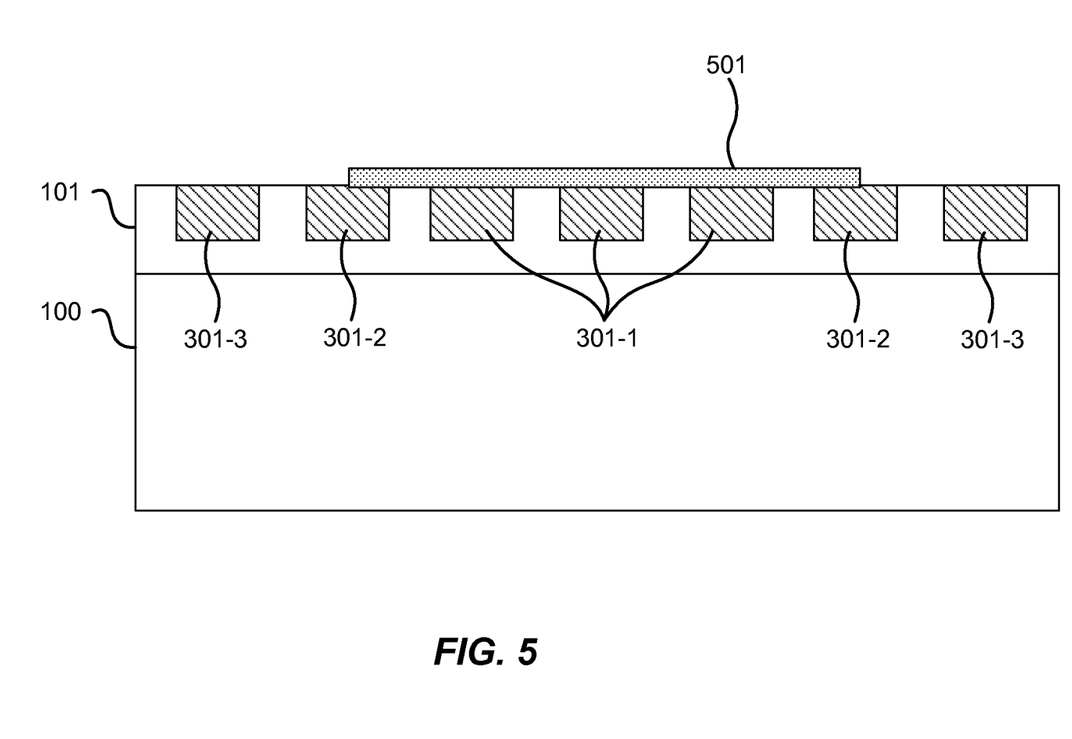

FIG. 5 illustrates the formation of a contact metal structure 501 on some of the regions 301, including the regions 301-1 and a portion of regions 301-2, as well as portions of the first GaN epitaxial layer 201 between these regions. The contact metal structure 501 can be one or more layers of metal and/or alloys designed to create a Schottky barrier with the first GaN epitaxial layer 101, which have a relatively low dopant concentration. At the same time, the contact metal structure 501 forms an ohmic contact with the regions 301-1, which have relatively high dopant concentration forming the P-i-N portions of the MPS diode. Remaining regions 301-2 and 301-3 can be utilized for edge termination of the MPS diode. The contact metal structure 501 can be formed using a variety of techniques, including lift-off and/or deposition with subsequent etching, which can vary depending on the metals used. In some embodiments, the contact metal structure 501 can include nickel, platinum, palladium, silver, gold, and the like.

The device illustrated in FIG. 5 provides for floating guard rings 301-3 at locations peripheral to the contact metal structure 501 where the p-type regrowth regions are positioned with no overlying metal contact. The structure also enables junction extension edge termination 301-2 where the contact metal structure 501 partially overlaps one of the p-type regrown regions.

Figure 6:
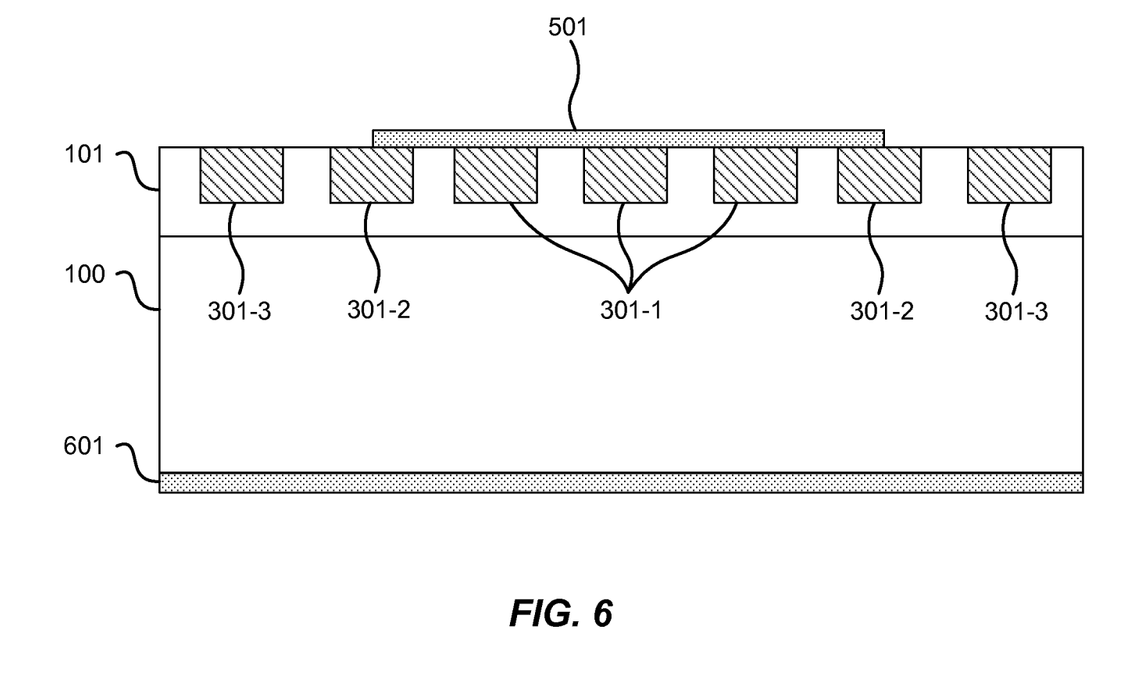

FIG. 6 illustrates the formation of a back metal structure 601 on the bottom of GaN substrate 100. The back metal structure 601 can be one or more layers of ohmic metal that serve as a contact for the cathode of the MPS diode. For example, the back metal structure 601 can comprise a titanium-aluminum (Ti/Al) ohmic metal. Other metals and/or alloys can be used including, but not limited to, titanium, aluminum, nickel, palladium, gold, combinations thereof, or the like. In some embodiments, an outermost metal of the back metal structure 601 can include gold, tantalum, tungsten, palladium, silver, or aluminum, combinations thereof, and the like. The back metal structure 601 can be formed using any of a variety of methods such as sputtering, evaporation, or the like.

Although some embodiments provided herein (e.g., the embodiment illustrated in FIGS. 1-6) are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in some implementations, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

In summary, the process flow illustrated in FIGS. 1-6 utilizes a suitable mask that is patterned on the wafer surface, allowing the drift layer to be etched to a fixed depth. Then the mask layer is removed. Subsequently, p-type GaN is regrown to fill the etched openings and extend on top of the drift layer. After regrowth, the p-type material may be annealed to activate the dopant. In some embodiments, other methods of activating dopants can be utilized as appropriate to the particular application. The substantially planar p-type GaN layer is etched back by a predetermined amount to define a desired thickness layer used to form the merged p-i-n and Schottky layer. Some of the regrown p-type regions may also function as edge termination and floating guard ring(s) for the MPS device. Metal is deposited on the top of the structure and patterned to form the MPS device with p-type islands within the Schottky contact. Backside ohmic metal may be deposited.

Figure 10:
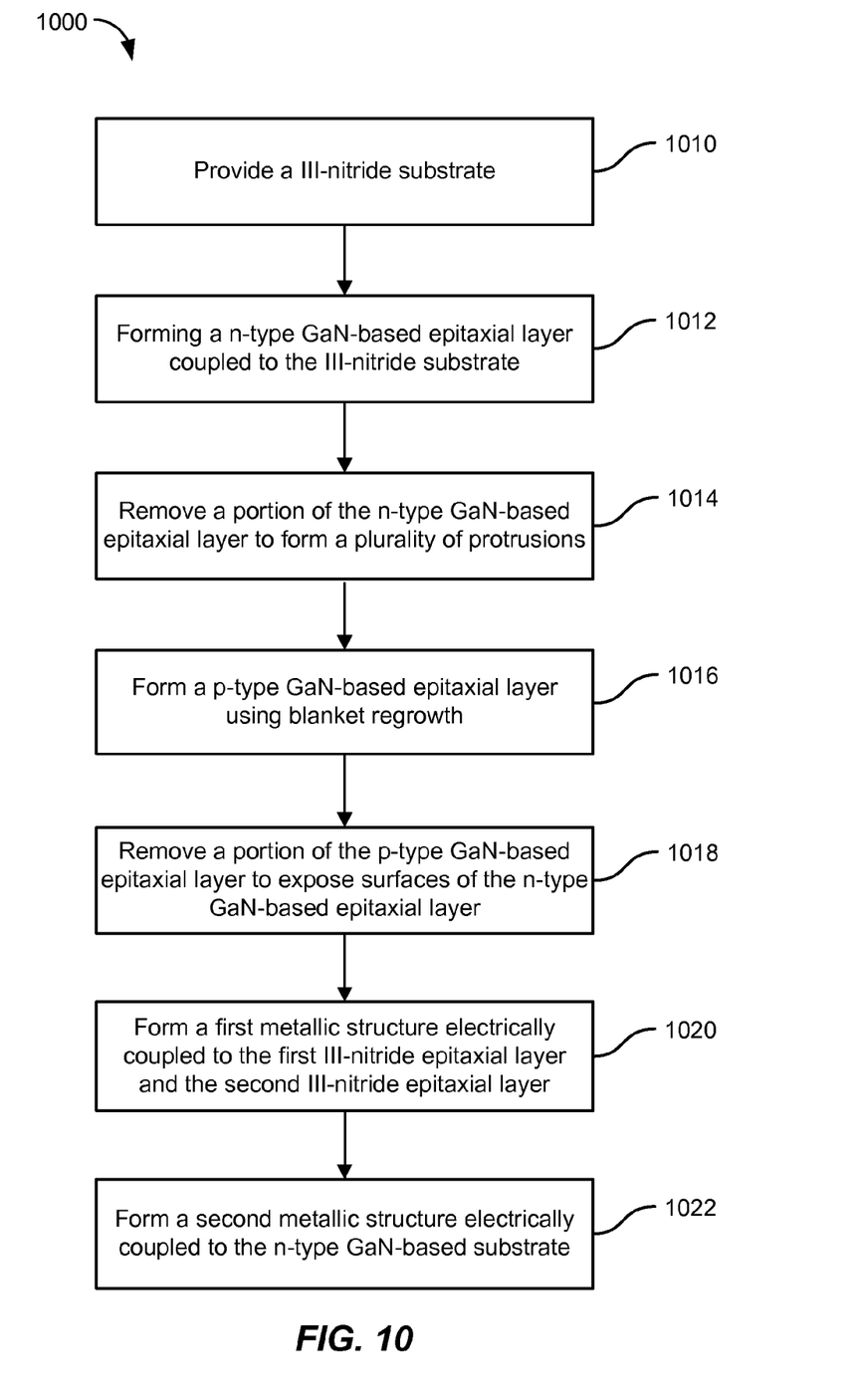
FIG. 10 is a simplified flowchart illustrating a method of fabricating an MPS diode according to an embodiment of the present invention.

FIG. 10 is a simplified flowchart illustrating a method of fabricating an MPS diode according to an embodiment of the present invention. The method 1000 is suitable for the fabrication of an MPS diode in gallium nitride (GaN) based materials. The method includes providing a n-type GaN-based substrate having a first surface and a second surface (1010) and forming an n-type GaN-based epitaxial layer coupled to the first surface of the n-type GaN-based substrate (1012). The n-type GaN-based substrate can be characterized by a first n-type dopant concentration and the n-type GaN-based epitaxial layer can be characterized by a second n-type dopant concentration less than the first n-type dopant concentration, which is a suitable design for an n-type drift layer.

The method also includes removing a portion of the n-type GaN-based epitaxial layer to form a plurality of protrusions extending to a predetermined distance from the first surface of the GaN-based substrate (1014) and forming a p-type GaN-based epitaxial layer using a blanket regrowth process (1016). The blanket regrowth fills the recessed regions between adjacent protrusions and covers the surface of the n-type GaN-based epitaxial layer. In some embodiments, the blanket regrowth results in a substantially planar regrowth surface, although this is not required by the present invention.

In an embodiment, removing a portion of the n-type GaN-based epitaxial layer includes masking portions of the n-type GaN-based epitaxial layer, etching unmasked portions of the n-type GaN-based epitaxial layer, and forming a plurality of recessed regions extending to a predetermined depth into the n-type GaN-based epitaxial layer. Thereby, the method forms the plurality of protrusions of n-type GaN-based epitaxial material.

Using an etch back process, the method includes removing a portion of the p-type GaN-based epitaxial layer to expose surfaces of the n-type GaN-based epitaxial layer (1018). The exposed surfaces have p-type GaN-based regions disposed therebetween, providing a surface with alternating p-type and n-type regions in a line running along the surface. The etch back process can provide a substantially planar surface such that the exposed surfaces of the n-type GaN-based epitaxial layer and upper surfaces of the p-type GaN-based regions are coplanar although this is not required by the present invention.

Additionally, the method includes forming a first metallic structure electrically coupled to the exposed surfaces of the n-type GaN-based epitaxial layer and the p-type GaN-based regions (1020). A Schottky contact is formed between the first metallic structure and the exposed surfaces of the n-type GaN-based epitaxial layer. Additionally, an ohmic contact is formed between the first metallic structure and the exposed surfaces of the regrown p-type epitaxial material. The method also includes forming a second metallic structure electrically coupled to the second surface of the n-type GaN-based substrate (1022). At least one of the p-type GaN-based regions is configured to provide edge termination to the MPS diode in some embodiments and at least one of the p-type GaN-based regions is configured to provide an edge termination region to the MPS diode in other embodiments.

It should be appreciated that the specific steps illustrated in FIG. 10 provide a particular method of fabricating an MPS diode according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
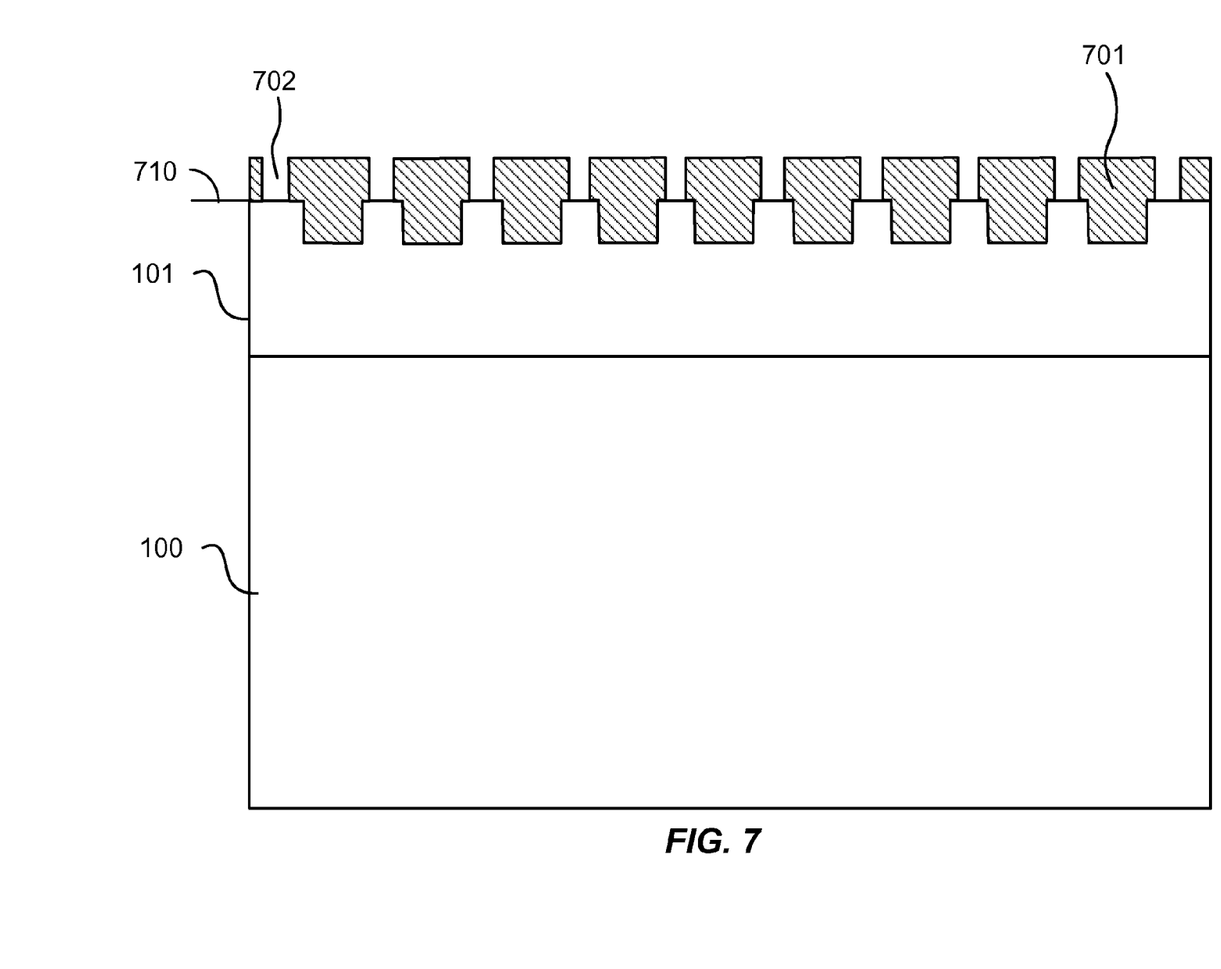
FIGS. 7-9 are simplified cross-sectional diagrams illustrating a process flow for the fabrication of an MPS diode according to a second embodiment of the present invention.
Figure 8:
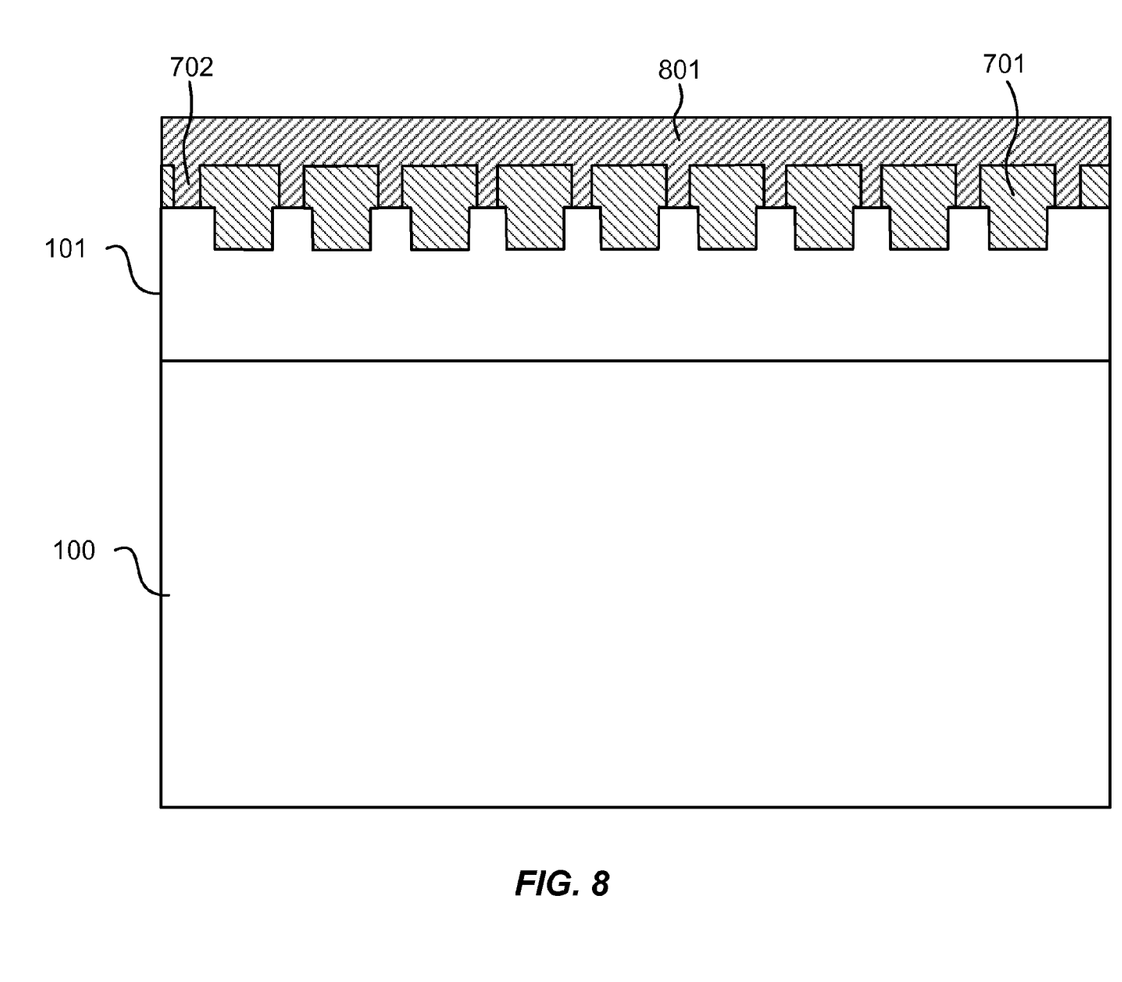
Figure 9:
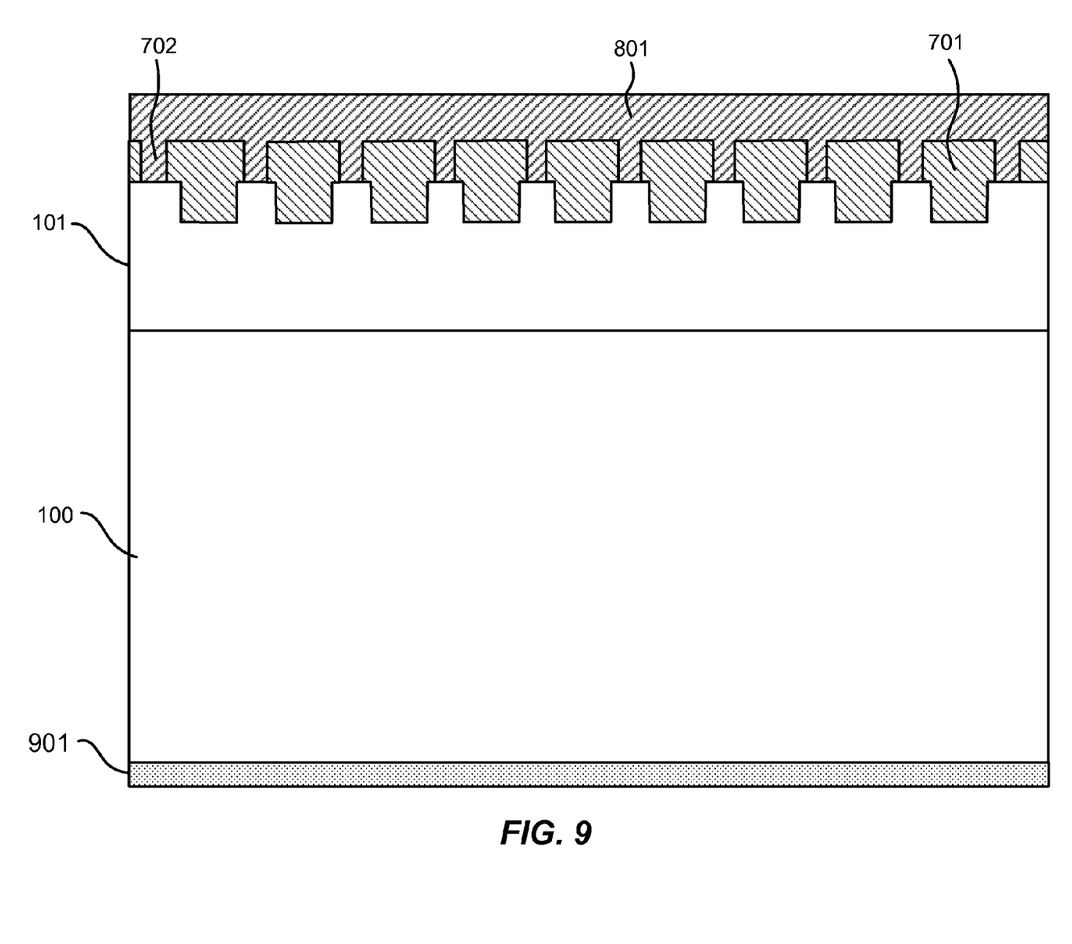

FIGS. 7-9 are simplified cross-sectional diagrams illustrating a process flow for the fabrication of an MPS diode according to a second embodiment of the present invention. FIG. 7 illustrates an alternative method of forming epitaxial regions according to an embodiment of the present invention. The structure illustrated in FIG. 7 is fabricated using the structure illustrated in FIG. 3. The structural properties, such as dopant concentrations and thicknesses, can vary from those in embodiments shown in FIGS. 1-6 or be similar, depending on desired functionality.

After the blanket regrowth illustrated in FIG. 3, rather than utilizing an etch back process to expose the upper surface of epitaxial layer 101 as shown in FIG. 4, the regrowth layer is masked and selectively etched in regions 702 to form epitaxial regions 701. During device operation, the structure illustrated in FIG. 7 may provide improvements in device performance in comparison to other designs in that the side walls of epitaxial regions 701 include two portions, a first portion disposed between protrusions of n-type material from the epitaxial layer 101 and located below height 710 and a second portion above height 710, which overhangs the first portion. During subsequent metallization, the metal (e.g., Schottky) contact will not touch the first portion since it is spatially separated from the first portion by the overhang produced by the second portion.

The design illustrated in FIG. 7 provides a design that accommodates differences in the regrown epitaxial material (i.e., comparing the bottom of the regrown material to the sidewalls of the regrown material). The overhanging material prevents electrical contact between the metallization (see 801 in FIG. 8) and the sidewalls between the extensions protruding from epitaxial layer 101. Because the sidewalls above height 710 are fabricated by etching into blanket regrown material, the electrical characteristics of these sidewalls are generally superior to the electrical characteristics of the sidewalls below height 710, providing a benefit by spatially separating the electrical contacts from the sidewalls below height 710. If, for example, a vertical current leakage path is introduced along the first portion of the side walls, then reduced leakage current may be achieved by separating the metal from the first portion of the sidewall using the structure fabricated using a selective or patterned etch as illustrated in FIG. 7. Thus, as illustrated in FIG. 7, the regrown material includes a plurality of III-nitride regions of a second conductivity type, each partially disposed between adjacent protrusions in the first epitaxial layer. Each of the plurality of III-nitride regions of the second conductivity type includes a first section laterally positioned between adjacent protrusions and a second section extending in a direction normal to the first side of the III-nitride substrate, with the second sections overhanging the first sections.

FIG. 8 illustrates formation of a contact metal structure 801 according to an embodiment of the present invention. As illustrated in FIG. 8, the regrown p-type GaN material includes a first portion (e.g., a first section) disposed between extension regions of the n-type GaN epitaxial material, the first portion being characterized by a first width measured in the plane of the substrate. The regrown p-type GaN material also includes a second portion (e.g., a second section) disposed above the original top surface of the n-type GaN epitaxial material, the second portion being characterized by a second width measured in the plane of the substrate that is greater than the first width. The overhang produced by the difference in widths provides a lateral separation between metal contact 801 and the sidewalls of the first portion of regrown material.

The contact metal structure 801 makes electrical contact with the top section of the regrown regions 701 as well as the exposed portions of the first III-nitride epitaxial layer. As illustrated in FIGS. 7 and 8, the protrusions in the first epitaxial layer 101 are characterized by sidewalls and a top surface extending between the sidewalls. As illustrated in FIG. 8, a spatial separation is present between the sidewalls and the contact metal structure, preventing current from flowing directly from the metal to the sidewalls. The overhang of the second section of the of the regrown material in comparison with the first section enables the metal contact to include elements that extend between the second sections of the regrown material to make electrical contact with the side surfaces of the second sections as well as the top surface of one or more of the protrusions in the first epitaxial layer.

Similar to the embodiment shown in FIG. 5, the contact metal structure 801 can be one or more layers of metal and/or alloys to create a Schottky barrier with the first GaN epitaxial layer 101, which have a relatively low dopant concentration. At the same time, the contact metal structure 801 can form an ohmic contact with the protrusions in the first epitaxial layer, which have a relatively high dopant concentration, forming the P-i-N portions of the MPS diode. Thus, although the contact metal structure 801 is referred to as a Schottky contact in some portions of the description, the contact metal structure can provide both Schottky and ohmic contact properties as appropriate to the semiconductor materials to which it is coupled. Remaining regrown regions can provide edge termination for the MPS diode. The contact metal structure 801 can be formed using materials and manufacturing techniques similar to that of the contact metal structure 501 in the embodiment of FIG. 5.

In the structure illustrated in FIG. 8, the regrown material 701 can have a varying doping concentration as a function of height, for example, with a heavily doped upper region providing a high conductivity material adjacent the ohmic portion of metal contact 801. Although FIGS. 7 and 8 illustrate a design utilizing selective etching in comparison to the blanket etch back illustrated in FIGS. 3 and 4, the structure illustrated in FIGS. 7 and 8 can utilize an initial blanket etch back to remove a portion of the regrown material and a subsequent selective etch to define the epitaxial regions 701. One of ordinary skill in the art would recognize many variations, modifications, and alternatives.

Although the metal contact is illustrated in FIG. 8 as extending across the width of the device, it will be evident that the lateral dimensions could be reduced to provide edge termination functionality as discussed in U.S. patent application Ser. No. 13/270,606, entitled "Method and System for Floating Guard Rings in GaN Materials," filed on Oct. 11, 2011, the disclosure of which is hereby incorporated by reference in its entirety for all purposes.

FIG. 9 illustrates the formation of a back metal structure 901 below the GaN substrate 100. As with the previous embodiment shown in FIGS. 1-6, back metal structure 901 can be one or more layers of ohmic metal that serve as a contact for the cathode of the MPS diode. For example, the back metal structure 901 can comprise a titanium-aluminum (Ti/Al) ohmic metal. Other metals and/or alloys can be used including, but not limited to, titanium, aluminum, nickel, palladium, gold, combinations thereof, or the like. In some embodiments, an outermost metal of the back metal structure 901 can include gold, tantalum, tungsten, palladium, silver, or aluminum, combinations thereof, and the like. The back metal structure 901 can be formed using any of a variety of methods such as sputtering, evaporation, or the like.

In summary, the process flow illustrated in FIGS. 1-3 and 7-9 illustrate another embodiment in which openings are etched in the substantially planar p-type regrown layer. The openings are etched to the top of the n-type GaN drift layer, corresponding to the desired locations of the Schottky contacts. Following this step, metal is deposited on the top of the structure and patterned to form the MPS device with p-type islands within the Schottky contact. An edge termination region may also be formed and a backside ohmic metal may be deposited.

Figure 11:
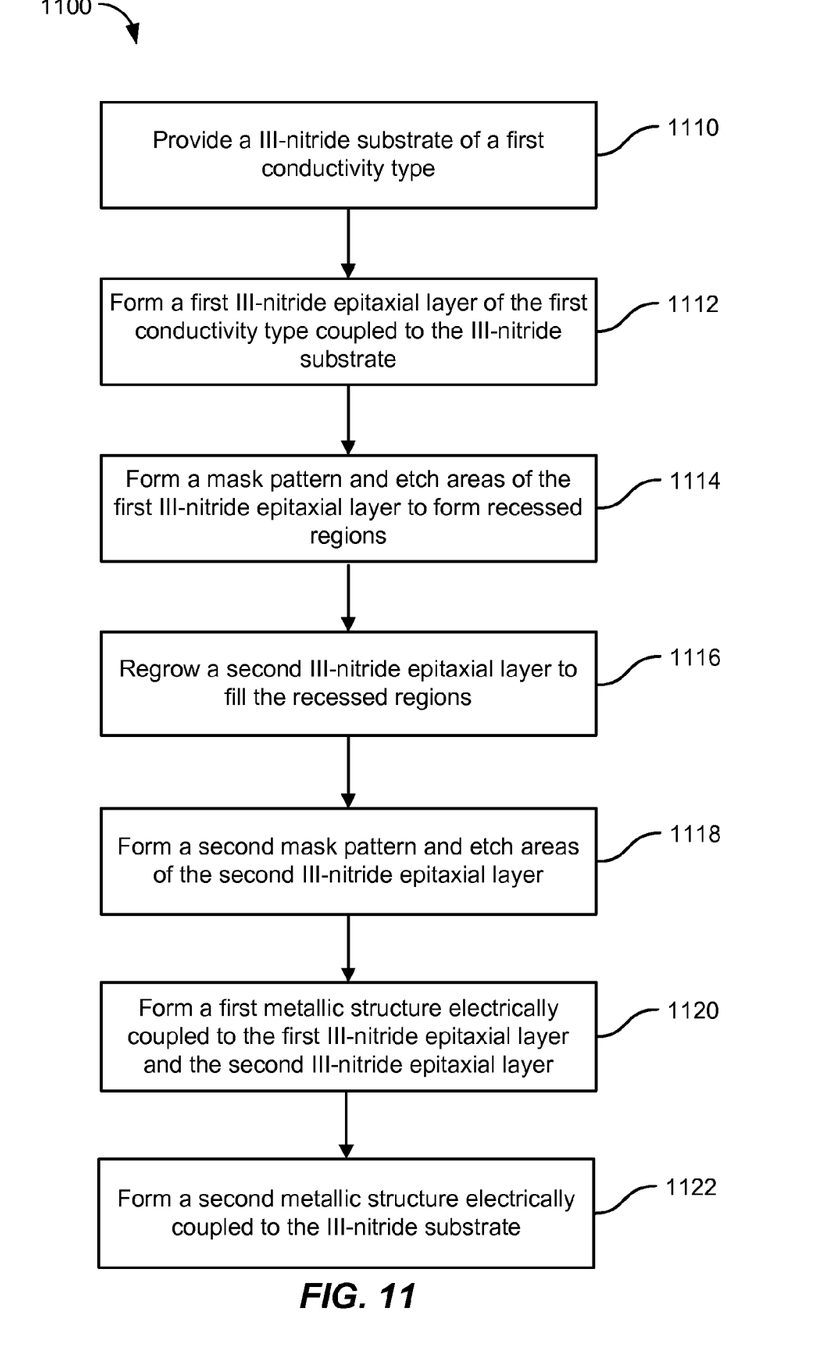
FIG. 11 is a simplified flowchart illustrating a method of fabricating an MPS diode according to another embodiment of the present invention.

FIG. 11 is a simplified flowchart illustrating a method of fabricating an MPS diode according to an embodiment of the present invention. The method 1100 includes providing a III-nitride substrate of a first conductivity type having a first surface and a second surface opposing the first surface (1110) and forming a first III-nitride epitaxial layer of the first conductivity type coupled to the first surface of the III-nitride substrate (1112). The first III-nitride epitaxial layer has a first surface adjacent the first surface of the III-nitride substrate and a second surface opposing the first surface. In some embodiments, the III-nitride substrate is characterized by a first dopant concentration and the first III-nitride epitaxial layer is characterized by a second n-type dopant concentration less than the first dopant concentration.

The method also includes forming a mask pattern coupled to the second surface of the first III-nitride epitaxial layer to define etch areas and etching the etch areas to form a plurality of recessed regions extending to a predetermined depth into the first III-nitride epitaxial layer (1114). The method further includes regrowing a second III-nitride epitaxial layer that fills the recessed regions and extends to a predetermined height from the second surface of the first III-nitride epitaxial layer (1116).

Additionally, the method includes forming a second mask pattern coupled to the second III-nitride epitaxial layer to define second etch areas and etching the second etch areas to define a plurality of regrown regions extending in a direction normal to the second surface of the first III-nitride epitaxial layer and to expose a plurality of portions of the first III-nitride epitaxial layer (1118). In an embodiment, the exposed plurality of portions of the first III-nitride epitaxial layer are individually interspersed between the plurality of regrown regions.

As illustrated in FIG. 7, a lateral width of each of the plurality of regrown regions measured in the plane of the second surface of the first III-nitride epitaxial layer is greater than a lateral width of each of the exposed plurality of portions of the first III-nitride epitaxial layer measured in the plane of the second surface of the first III-nitride epitaxial layer.

After the mask/etch/regrowth processes, the method includes forming a first metallic structure electrically coupled to one or more of the plurality of regrown regions and one or more of the exposed portions of the first III-nitride epitaxial layer (1020). The first metallic structure can include Schottky contacts to first portions of the epitaxial structure (i.e., the first GaN epitaxial layer) and ohmic contacts to second portions of the epitaxial structure (i.e., the regrown p-type material). A second metallic structure electrically coupled to the second surface of the III-nitride substrate is formed to provide an ohmic contact to the diode (1022). Additionally, at least one of the plurality of regrown regions can be configured to provide edge termination to a semiconductor device or a junction termination extension to a semiconductor device.

It should be appreciated that the specific steps illustrated in FIG. 11 provide a particular method of fabricating an MPS diode according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an MPS diode, the method comprising:
   providing a III-nitride substrate of a first conductivity type having a first surface and a second surface opposing the first surface;
   forming a first III-nitride epitaxial layer of the first conductivity type coupled to the first surface of the III-nitride substrate, the first III-nitride epitaxial layer having a first surface adjacent the first surface of the III-nitride substrate and a second surface opposing the first surface;

forming a mask pattern coupled to the second surface of the first III-nitride epitaxial layer to define etch areas;

etching the etch areas to form a plurality of recessed regions extending to a predetermined depth into the first III-nitride epitaxial layer;

regrowing a second III-nitride epitaxial layer that fills the recessed regions and extends to a predetermined height from the second surface of the first III-nitride epitaxial layer, wherein the second III-nitride epitaxial layer is lattice matched with the first III-nitride epitaxial layer;

forming a second mask pattern coupled to the second III-nitride epitaxial layer to define second etch areas;

etching the second etch areas to define a plurality of regrown regions extending in a direction normal to the second surface of the first III-nitride epitaxial layer and to expose a plurality of portions of the first III-nitride epitaxial layer;

forming a first metallic structure electrically coupled to one or more of the plurality of regrown regions and one or more of the exposed portions of the first III-nitride epitaxial layer; and forming a second metallic structure electrically coupled to the second surface of the III-nitride substrate.

2. The method of claim 1 wherein the first metallic structure comprises a Schottky contact to the exposed portions of the first III-nitride epitaxial layer and an ohmic contact to the one or more of the plurality of regrown regions.

3. The method of claim 1 wherein the exposed plurality of portions of the first III-nitride epitaxial layer are individually interspersed between the plurality of regrown regions.

4. The method of claim 1 wherein a lateral width of each of the plurality of regrown regions measured in the plane of the second surface of the first III-nitride epitaxial layer is greater than a lateral width of each of the exposed plurality of portions of the first III-nitride epitaxial layer measured in the plane of the second surface of the first III-nitride epitaxial layer.

5. The method of claim 1 wherein the III-nitride substrate is characterized by a first dopant concentration and the first III-nitride epitaxial layer is characterized by a second n-type dopant concentration less than the first dopant concentration.

6. The method of claim 1 wherein at least one of the plurality of regrown regions is configured to provide edge termination to a semiconductor device.

7. The method of claim 1 wherein at least one of the plurality of regrown regions is configured to provide a junction termination extension to a semiconductor device.

8. The method of claim 1 wherein:
the first III-nitride epitaxial layer is GaN; and
the first conductivity type is n-type.

9. The method of claim 1 wherein:
each of the plurality of regrown regions comprises a first section and a second section;
the first section, of each of the plurality of III-nitride regions, is disposed between portions of the first III-nitride epitaxial layer; and
the second section, of each of the plurality of III-nitride regions, extends beyond a height of portions of the first III-nitride epitaxial layer and has a width greater than a width of a corresponding first section such that the second section overhangs the corresponding first section.

10. The method of claim 9 wherein the first section of each of the plurality of regrown regions has a thickness measured in a direction normal to the first surface of the III-nitride substrate, and the thickness is between 0.1 microns and 5 microns.

11. The method of claim 1 wherein the first III-nitride epitaxial layer is formed to have a thickness measured in a direction normal to the first surface of the III-nitride substrate, and the thickness is between 0.5 microns and 100 microns.

12. The method of claim 11 wherein the thickness is between 5 microns and 100 microns.

13. The method of claim 1 wherein:
the plurality of regrown regions have a doping concentration in a range from $10^{17}$ to $2\times10^{20}$ cm$^{-3}$;
the first III-nitride epitaxial layer has a doping concentration in a range from $10^{17}$ to $2\times10^{20}$ cm$^{-3}$; and
the III-nitride substrate has a doping concentration in a range from $10^{17}$ to $1\times10^{20}$ cm$^{-3}$.

* * * * *